(12) United States Patent
Joshi (10) Patent No.: US 8,524,532 B1
(45) Date of Patent: Sep. 3, 2013

(54) INTEGRATED CIRCUIT PACKAGE INCLUDING AN EMBEDDED POWER STAGE WHEREIN A FIRST FIELD EFFECT TRANSISTOR (FET) AND A SECOND FET ARE ELECTRICALLY COUPLED THEREIN

(75) Inventor: Rajeev Joshi, Cupertino, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/406,257

(22) Filed: Feb. 27, 2012

(51) Int. Cl.
*H01L 21/00* (2006.01)
(52) U.S. Cl.
USPC ............................ 438/107; 257/E21.499
(58) Field of Classification Search
USPC .............. 438/107, 237, 270, 113, 123, 108, 438/112, 109, 127, 167; 257/E23.044, E23.052, 257/E25.018, E23.085, E21.499
See application file for complete search history.

(56) References Cited

U.S. PATENT DOCUMENTS

| 2007/0215996 A1* | 9/2007 | Otremba ....................... 257/678 |
| 2007/0262346 A1* | 11/2007 | Otremba et al. .............. 257/177 |
| 2008/0017907 A1* | 1/2008 | Otremba ....................... 257/306 |
| 2008/0061396 A1* | 3/2008 | Havanur ....................... 257/500 |

\* cited by examiner

*Primary Examiner* — Bilkis Jahan
(74) *Attorney, Agent, or Firm* — Eugene C. Conser; Wade J. Brady, III; Frederick J. Telecky, Jr.

(57) ABSTRACT

One aspect of the invention pertains to an integrated circuit package with an embedded power stage. The integrated circuit package includes a first field effect transistor (FET) and a second FET that are electrically coupled with one another. The FETs are embedded in a dielectric substrate that is formed from multiple dielectric layers. The dielectric layers are laminated together with one or more foil layers that help form an electrical interconnect for the package. Various embodiments relate to method of forming the above package.

16 Claims, 6 Drawing Sheets

INTEGRATED CIRCUIT PACKAGE INCLUDING AN EMBEDDED POWER STAGE WHEREIN A FIRST FIELD EFFECT TRANSISTOR (FET) AND A SECOND FET ARE ELECTRICALLY COUPLED THEREIN

FIELD OF THE INVENTION

The present invention relates to integrated circuit packaging. More specifically, it relates to an integrated circuit package with a power stage module that is embedded in a printed circuit board or a laminated dielectric substrate.

BACKGROUND OF THE INVENTION

A DC/DC converter is a circuit that converts an electrical current from one voltage level to another. Such circuits are used in a wide variety of electrical devices. By way of example, different components in the same electrical device may have different voltage requirements, which can be managed using one or more converters.

A component of a DC/DC converter is the power stage. A common type of power stage is the H-bridge configuration. In the H-bridge configuration, two asymmetric field effect transistors (FETs), a high side FET (HSFET) and a low side FET (LSFET) are coupled with one another and an inductor.

Some approaches for forming power converters involve placing a FET on a metallic leadframe. The FET can be connected to the leadframe using wirebonds. Alternatively, the FET can be connected to the leadframe with solder bumps in a flip chip-style arrangement. In some implementations, a smaller HSFET is stacked on a larger LSFET that is in turn mounted on the leadframe.

In another design, a single FET is embedded in a printed circuit board (PCB). Various conductive traces and vias are interspersed between the dielectric layers that make up the substrate. A passive device (such as an inductor) may be mounted on the PCB. Portions of the PCB or the passive device may be encapsulated in molding material.

Although the above approaches work well for various applications, there are continuing efforts to improve the efficiency and reliability of power converters.

SUMMARY OF THE INVENTION

In one aspect of the present invention, a method for forming a power stage module is described. Initially, a first field effect transistor (PET) module is provided. The first PET module includes a PET that is encased in a laminated, dielectric substrate. Multiple metallic posts are formed on surfaces of the PET. The dielectric substrate is formed from multiple dielectric layers that cover the metallic posts and the PET. The top and bottom surfaces of the dielectric substrate are covered with top and bottom foil layers. In some embodiments, the entire surface of the PET can be metalized and the vias are drilled and then filled. That is, the PETs themselves need not have discrete vias in them.

Multiple holes are formed through the foil layers and the dielectric substrate to expose the metallic posts on the top and bottom surfaces of the FET. The holes may be formed, for example, using a laser. Metal is electroplated into the holes to form electrically conductive vias. As a result, each foil layer on the dielectric substrate is electrically connected to the FET through one or more of the vias. A second FET is positioned over the first FET module such that the second FET is in electrical and physical contact with the top foil layer on the first FET module. As a result, a drain of the first FET is electrically connected to a source of the second FET through the top foil layer. In various embodiments, the first and second FETs are low and high side FETs in an H-bridge configuration. (This approach assumes that both FETs are N-Channel FETs, although other approaches are also possible.)

Additional dielectric and/or foil layers are positioned around the second FET. Optionally, holes are formed and electroplated with metal to form additional vias. The additional layers cooperate to form a second FET module. The first and second FET modules are laminated together to form a power stage module.

A wide variety of techniques may be used to form the aforementioned power stage module. For example, the second FET module may be formed gradually by sequentially depositing one or more layers and/or components on the first FET module. One or more lamination operations may be used to bond these layers together with the first FET module. Alternatively, the second FET module may be separately formed and then attached as a single structure to the first FET module. That is, multiple dielectric layers, foil layers and an encased FET can be laminated together to form the second FET module. Afterward, the second FET module is aligned over and laminated together with the first FET module.

Some implementations involve attaching an active or passive device, such as a capacitor, inductor or integrated circuit. By way of example, an inductor or integrated circuit can be mounted over a laminate structure that contains the two FETs. In some approaches, portions of the active/passive device and/or the structure are encapsulated in molding material.

Another aspect of the present invention relates to an integrated circuit package formed using at least some of the steps of the above method.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of integrated circuits. More specifically, the present invention relates to a power stage module that is embedded in printed circuit board or a laminated dielectric substrate.

A power stage module involves two field effect transistors (FET), a high side FET (HSFET) and a low side FET (LSFET). The LSFET and HSFET are electrically coupled such that the drain of the LSFET is connected to the source of the HSFET (i.e., the switch node.) In various applications, it is desirable to minimize the electrical resistance at the switch node. However, in other applications, this is less of a priority, as arranging the electrical connections in the power stage module to reduce conduction losses can result in an increase in the size of the package.

When the LSFET and HSFET are stacked over one another, it can be particularly advantageous to improve the efficiency of the power stage module. Power losses generate increased heat within the package, and the heat tends to travel directly through the stacked integrated circuits.

In various prior art designs, an HSFET is stacked over an LSFET, which is in turn mounted on a leadframe. The electrical connections in such designs typically involve either bonding wires or solder bumps. Bonding wires, however, have relatively high electrical resistance. Solder bumps are generally better conductors than bonding wires, but they have other limitations. There is a limit to how many solder bumps can be placed in a given area, since there needs to be some amount of mechanical clearance between the bumps. They also require additional processing steps (e.g., the printing of solder paste, a reflow operation, etc.) In a flip chip, leadframe-based package, there is limited flexibility in the design of the electrical interconnects within the package. That is, in such packages most or all of the electrical routing takes place at the level of the leadframe. Also, in some prior art designs, most of the materials used involve high lead materials (non-ROHS). Various embodiments of the present invention involve an approach to achieve low power loss, i.e., "green" interconnect at a system level.

Various embodiments of the present invention address these issues. In a particular implementation, a power stage module including high side and low side FETs is embedded in a laminated dielectric substrate. Conductive vias and foil layers electrically connect the FETs with one another and/or contacts on the exterior of the package. In some implementations, the vias are formed through laser drilling and electroplating. The foil layers can be etched from metallic foils that are laminated together with the dielectric layers in the package. Accordingly, the power density can be greater and there is greater flexibility in the design of the electrical interconnects in the package. That is, the electrical connections can be formed more precisely and arranged more densely than is the case with solder bumps or bonding wires. As a result, power losses and heat generation within the package can be reduced.

Figure 1:
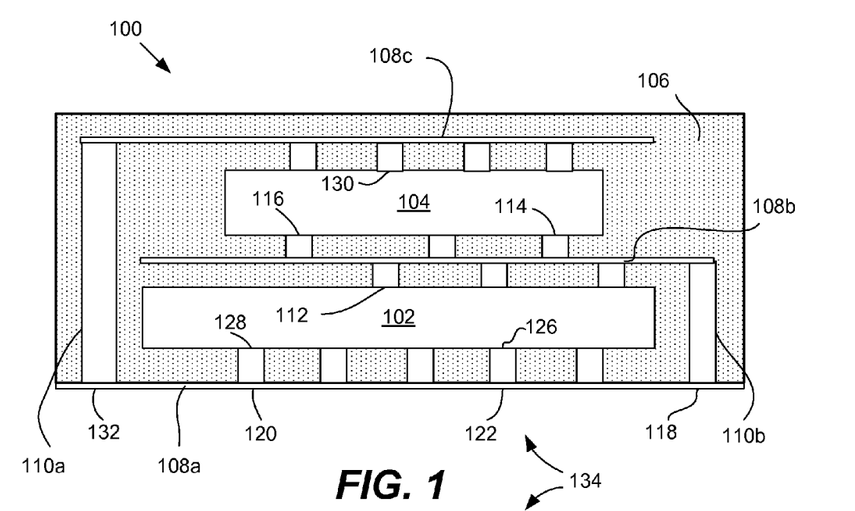
FIG. 1 is a diagrammatic side view of an integrated circuit package with an embedded power stage according to a particular embodiment of the present invention.

Referring now to FIG. 1, an integrated circuit package 100 according to a particular embodiment of the present invention will be described. The package 100 includes a power stage made of a low side field effect transistor (LSFET) 102 and a high side field effect transistor (HSFET) 104. The LSFET 102 and HSFET 104 are electrically coupled to one another and are encapsulated in a laminated dielectric substrate 106 (e.g., printed circuit board.) In various designs, the LSFET 102 and HSFET 104 are arranged in an H-bridge configuration. The package includes multiple conductive vias and foil layers (i.e., first foil layer 108a, second foil layer 108b, third foil layer 108c, first via 110a and second via 110b). Each foil layer includes multiple conductive traces that are etched from a metallic foil. Each of these traces is arranged to route electrical signals between the FETs or from a FET to a contact on the exterior of the package.

The foil layers are laminated together with the dielectric substrate 106 and can be positioned above or below any FET in the package. The vias can be formed in almost any location in the package and can be arranged to electrically connect a foil layer to another underlying foil layer or to an external contact.

The above arrangement allows for a wide variety of electrical interconnect designs. In the illustrated embodiment, for example, the LSFET 102 and HSFET 104 are electrically coupled with one another through the second foil layer 108b, which is sandwiched between the LSFET 102 and the HSFET 104. In the example illustrated in FIG. 1, a drain contact 112 on the top surface of the LSFET 102 is physically and electrically coupled to the second foil layer 108b, which is in turn connected to a source contact 114 on the bottom surface of the HSFET 104. This LS drain/HS source connection (i.e. the switch node) is further physically and electrically coupled to contact 118 on the bottom surface of the package 100 via the second foil layer 108b and the second via 110b. Additionally, a gate contact 116 on the bottom surface of the HSFET 104 is electrically coupled to a contact (contact 124 in FIG. 2) on the exterior of the package via the second foil layer and another via (not shown.) A source contact 126 and a gate contact 128 on the bottom surface of the LSFET 102 are attached via conductive vias to exposed contacts 122 and 120, respectively, in the first foil layer 108a at the bottom of the package 100. A drain contact 130 on the top surface of the HSFET 104 is electrically and physically connected to another exposed contact 132 in the first foil layer 108a through the third foil layer 108c and the first via 110a that extends between and directly connects the first and third foil layers.

It should be appreciated, however, that FIG. 1 represents only a single embodiment of the present invention. The present invention also contemplates a wide variety of alternative embodiments that depart from what is shown in FIG. 1. By way of example, the foil layers and vias may intersect at different locations or be arranged in different ways. The LSFET 102 and HSFET 104 may be stacked such that their respective top and bottom surfaces directly face one another or they may be offset from one another. The foil layers may be arranged along parallel planes and/or be offset from one another. Although in the illustrated embodiment the third foil layer 108c is covered with dielectric material, in other embodiments at least portions of it are exposed and/or are used to form contact pads for connecting the package to an external electrical device.

The LSFET 102 and HSFET 104 may have similar or different sizes. In a particular design, the footprint of the HSFET 104 is larger than the LSFET 102. More specifically, the bottom surface of the HSFET 104 is larger than, completely covers and extends beyond the periphery of the top surface of the LSFET 102. Stacked dice in various conventional leadframe-based packages tend not to be arranged in this manner. That is, in such packages, the lower die, which is mounted on the leadframe, generally has a larger footprint than the upper die so that the upper die is properly supported during the packaging process. The sizes of the FETs may vary, depending on the duty cycle and the application. For example, in a step down DC/DC converter the HS FET may be smaller than the LS FET.

Figure 2:
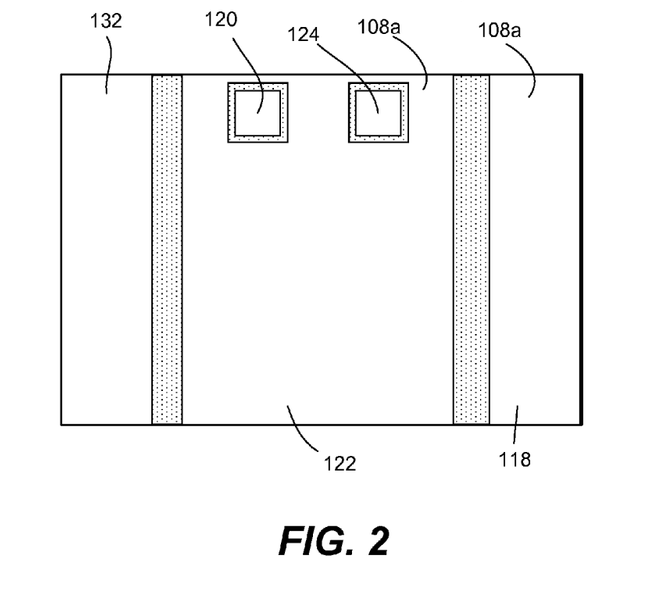
FIG. 2 is a diagrammatic bottom view of the integrated circuit package illustrated in FIG. 1.

Referring next to FIG. 2, the bottom surface of the package illustrated in FIG. 1 will be described. The exposed first foil layer 108a has been etched to form multiple isolated electrical contacts that can be used to attach the package to external electrical devices. These contacts are connected to the internal circuitry of the package through various vias and foil layers as illustrated in FIG. 1.

There are numerous ways in which the internal components of the package can be connected to the contacts on the exterior of the package. In the illustrated embodiment, for example, contact 132 is electrically connected to the drain contact 130 on the top surface of the HSFET 104 illustrated in FIG. 1. Contact 122 is electrically coupled to the source contact 126 on the bottom surface of the LSFET 102. (In various implementations this contact is electrically grounded.) Contact 118 is electrically connected to the source contact 114 and the drain contact 112 on the HSFET 104 and the LSFET 102, respectively. Contacts 120 and 124 are connected, respectively, to the gate contact 128 on the bottom surface of the HSFET 104 and the gate contact 116 on the bottom surface of the LSFET 102. The contacts are separated from one another by portions of the dielectric substrate 106. Many other arrangements are also possible. Although FIGS. 1 and 2 illustrate a package in which only a single (bottom) surface includes contacts, contacts may be formed on other surfaces of the package as well (e.g., the opposing top surface as well as the bottom surface.) The contacts may have any suitable shape or size. In some embodiments the contacts are arranged in a ball grid array and are arranged to be soldered to an underlying substrate.

Figure 5:
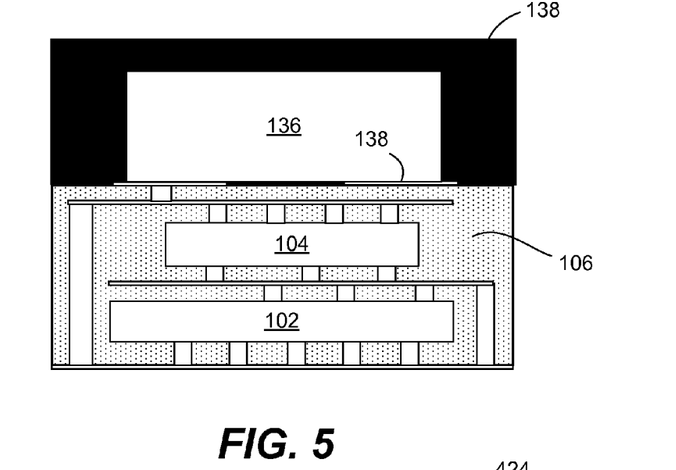
FIG. 5 is a diagrammatic side view of an integrated circuit package with an embedded power stage and an attached electrical device according to a particular embodiment of the present invention.

Some designs involve adding additional electrical components to the package. For example, an active device (e.g., an integrated circuit) or a passive device (e.g., a capacitor or inductor) can be embedded in the package or mounted on a surface of the substrate illustrated in FIG. 1. A particular example of such a design is shown in FIG. 5. Either of these approaches can provide a means for a low resistance, inductance interconnect from an external device to the power stage electrical nodes.

FIG. 5 illustrates a package that includes two FETs (LSFET 102 and HSFET 104) that are embedded in a laminated dielectric substrate 106 and an electrical device 136 that is mounted on the laminated structure. Generally, the arrangement of the components in the dielectric substrate 106 can be similar or identical to the substrate 106 illustrated in FIG. 1. In the illustrated embodiment, the electrical device 136 is encapsulated in molding material 138 (although this is optional.) It should be appreciated that FIG. 5 illustrates only one design involving an additional electrical device and that many other arrangements are also possible. In some implementations, for example, no molding material is used and the electrical device is exposed. In another embodiment, the electrical device and the top and side surfaces of the dielectric substrate are encapsulated in molding material while the bottom surface of the substrate is left exposed.

Generally, the foil layers and vias can be made of any electrically conductive material, such as copper. The dielectric substrate 106 is formed from any suitable dielectric material (e.g., printed circuit board, a prepreg material, polymer or a non-conductive epoxy material.) The dimensions of the various components may vary widely between different implementations. By way of example, each foil layer may have a thickness of approximately between 20-30 microns. Each FET may have a thickness of between 200 and 250 microns, although thinner and thicker FETs may also be used.

Figure 3:
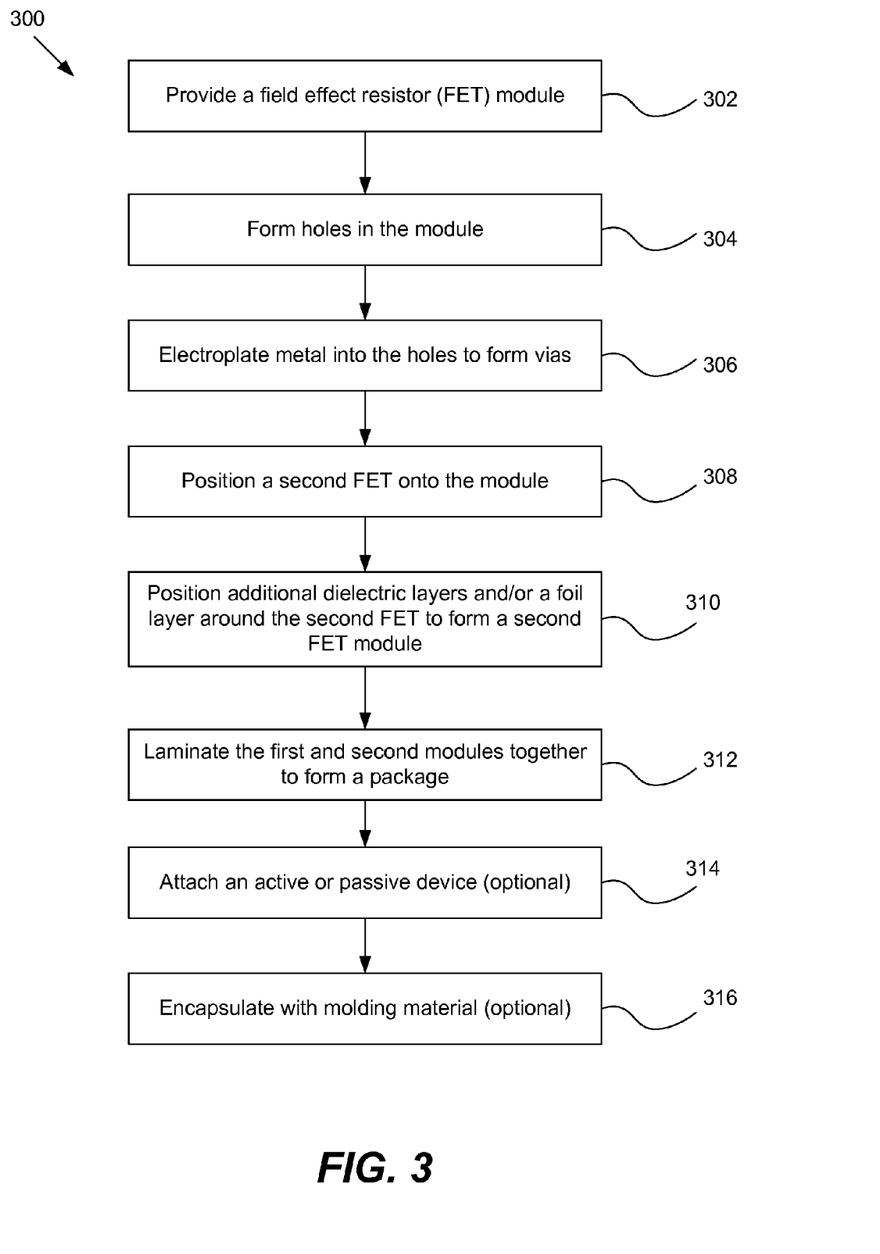
FIG. 3 is a method for forming the integrated circuit package illustrated in FIG. 1 according to a particular embodiment of the present invention.
Figure 4A:
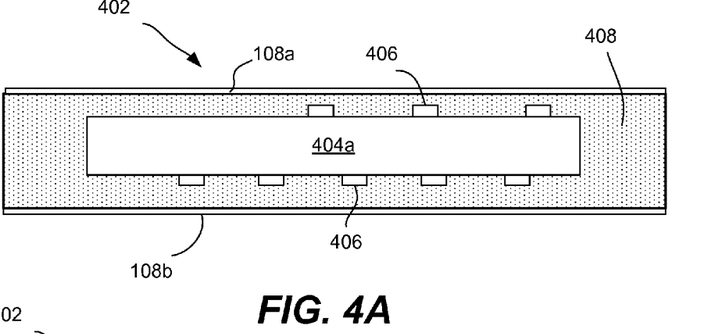
FIGS. 4A-4H are diagrammatic side views of various steps in the method described in FIG. 3.

Referring next to FIG. 3 and FIGS. 4A-4H, a method 300 for forming the package illustrated in FIG. 1 will be described. Initially, a first field effect resistor (FET) module 402 of FIG. 4A is provided (step 302 of FIG. 3.) The field effect resistor module 402 includes a first FET 404a that is encased in one or more dielectric layers that are laminated together to form a dielectric substrate 408. The substrate 106 is sandwiched between two foil layers, first foil layer 108a and the second foil layer 108b. The foil layers have been etched to form multiple conductive paths or pads.

On the top and bottom surfaces of the encased FET are multiple metallic posts 406. In some embodiments, the metallic posts 406 range from approximately 3 to 7 microns in thickness, although the posts may also be thicker or thinner. Metallic posts with a thickness of approximately 5 microns or less work well for various applications. For example, the thickness of the posts in some designs are between 3 and 5 microns, as at thicknesses lower than 3 microns there may be a danger of the laser blasting into the device. Any suitably conductive metal may be used to form the posts, such as copper. The metallic posts 406 are also covered and encased in the dielectric substrate 408. The posts 406 serve as electrical contacts for the first FET 404a and are physically connected to the circuitry within the FET.

Figure 4B:
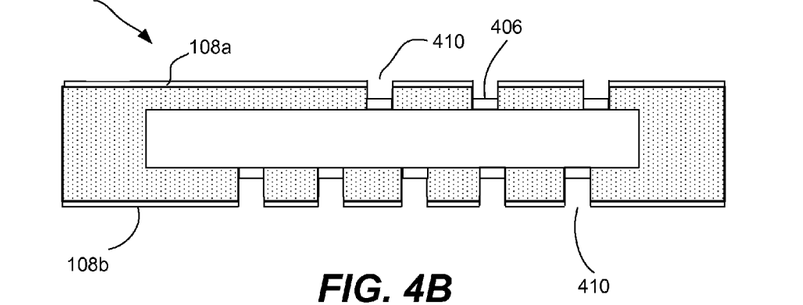

In step 304 of FIG. 3 and FIG. 4B, holes 410 are drilled or formed in the first FET module 402. The holes 410 penetrate through the foil layers and into the dielectric substrate 408 to expose the metallic posts 406. The holes 410 may be formed using any suitable technique. In various implementations, a laser is used to form the holes and ablate away the dielectric material.

Figure 4C:
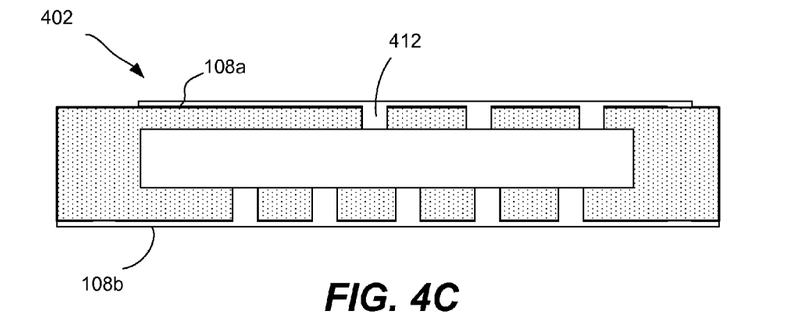

Afterward, a metal is electroplated into the holes (step 306 of FIG. 3). For example, in a particular implementation, a seed layer is applied over each hole. The seed layers are covered using a suitable photoresist, which may be positive or negative. The photoresist is then patterned and developed to form various open regions in which the seed layer is exposed. An electrical current is run through the seed layer, which causes metal to accumulate within the holes. This accumulation of metal forms electrically conductive vias (e.g., see vias 412 in FIG. 4C) that are connected to the metallic posts 406 on the top and bottom surfaces of the first FET 404a.

Additional layers and components are then built over the module. This may be done gradually, layer by layer. Alternatively, additional layers and a second FET may be pre-laminated together to form a second FET module. This second FET module may then be aligned with and laminated together with the FET module. Examples of both approaches will be discussed below.

Figure 4D:
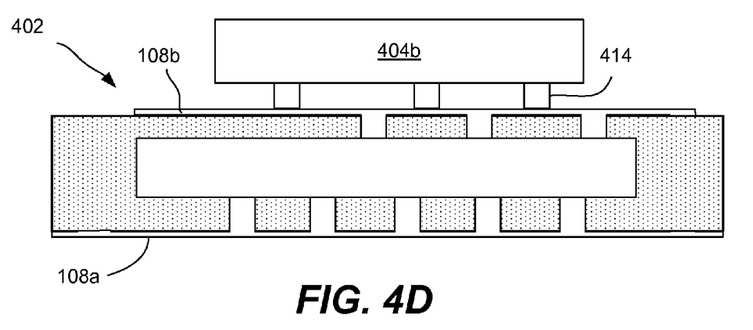

In an example of a more gradual approach, in FIG. 4D a second FET 404b is positioned on the first FET module 402. The second FET 404b has metallic posts 414 on its bottom surface, which in some embodiments have the same dimensions and characteristics as the metallic posts 406 in FIGS. 4A-4B. These metallic posts 414 electrically and physically connect the second FET 404b to the traces of the second foil layer 108b (step 308 of FIG. 3)

Figure 4E:
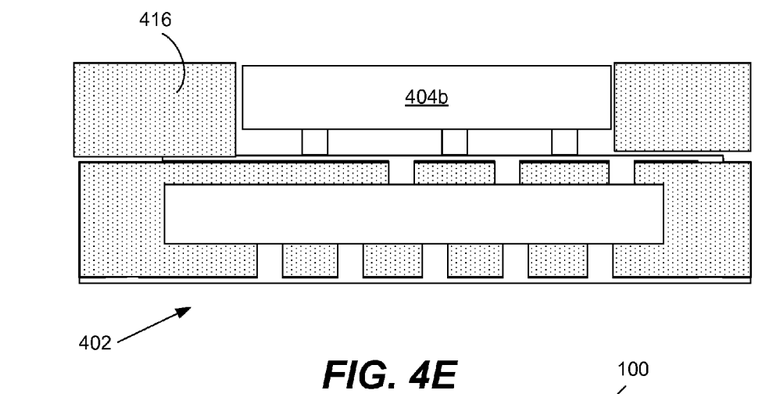

Additional layers are then positioned around the second FET using any technique known to persons of ordinary skill in the field of integrated circuit packaging and printed circuit board fabrication (FIGS. 4E and 4F and step 310 of FIG. 3) The additional layers can include one or more dielectric and/or foil layers. In the illustrated embodiment of FIG. 4E, for example, a dielectric layer 416 is positioned over the first FET module and the second foil layer. The dielectric layer 416, which includes an aperture, is positioned such that the second FET 404b fits within the aperture. A third foil layer 108c of FIG. 4F and one or more additional dielectric layers are then positioned over the dielectric layer 416 and the second FET 404b. The additional layers and the second FET 404b collectively form a second FET module.

Figure 4F:
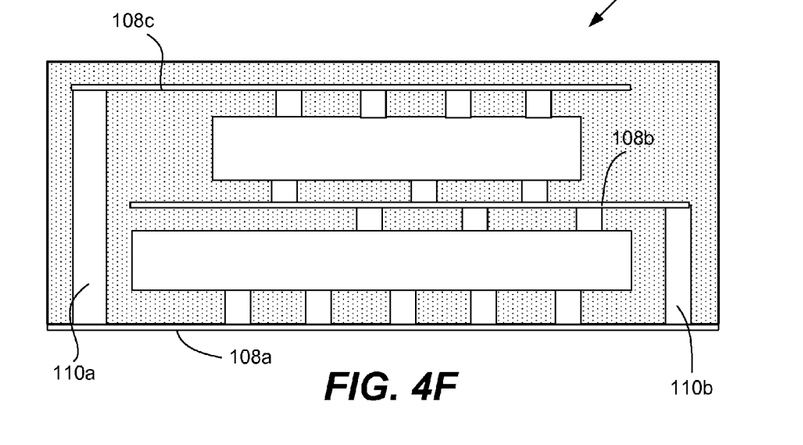

Afterward, the first and second FET modules, once suitably aligned and positioned over one another, are laminated together (step 312 of FIG. 3 and FIG. 4F.) The lamination process involves subjecting the two modules to substantial amounts of heat and pressure (e.g., pressures between 150 and 650 psi and temperatures between 125° C. and 200° C. for up to 3-4 hours. In some lamination processes, a temperature of approximately around 200° C. or 180-200° C. works well.) The lamination causes the two modules to form a single structure that encases the multiple FETs.

Figure 4G:
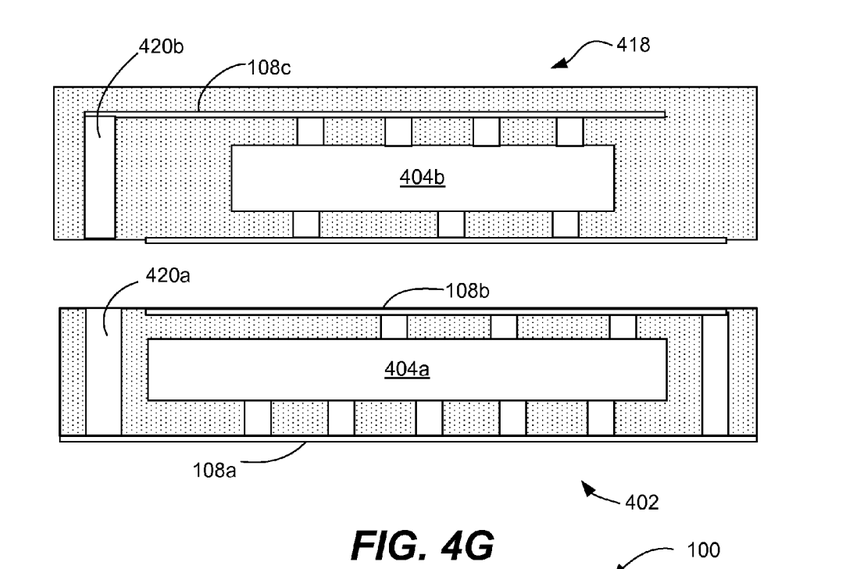
Figure 4H:
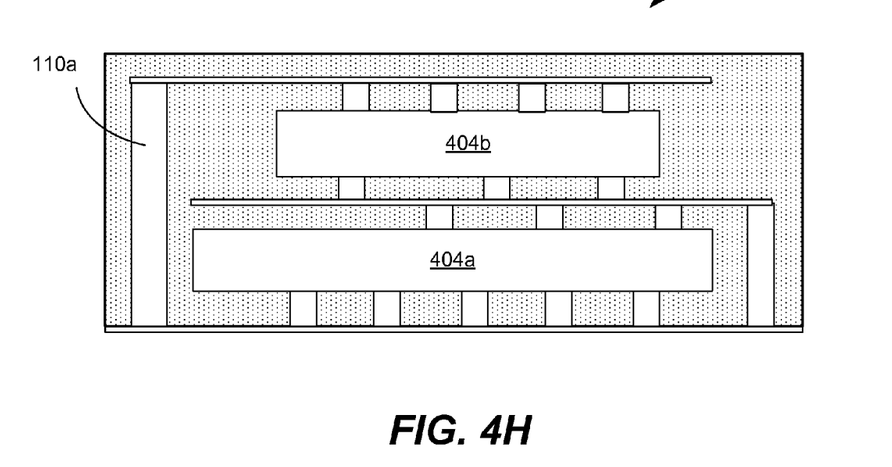

In some embodiments, one or more additional vias are formed at this stage. For example, vias 110a and 110b can be formed using the techniques described earlier to form vias 412 of FIG. 4C (e.g., laser drilling, electroplating, etc.) Such vias can be formed before or after the aforementioned lamination step (step 312 of FIG. 3). The resulting package is illustrated in FIG. 4H, which can be identical to the package 100 illustrated in FIG. 1.

Another approach for forming the integrated circuit package 100 is to preform and prelaminate the second FET module, and then to laminate the second FET module together with the first FET module. In FIG. 4G, for example, a preformed, second FET module 418 is illustrated. The preformed second FET module 418 includes one or more dielectric layers that have been pre-laminated around the second FET 404b. One or more foil layers are interspersed between dielectric layers in the second FET module 418. In this example, there is a foil layer on the bottom surface of the second FET module 418 that is arranged to be electrically and physically coupled to the second foil layer 108b on the top surface of the first FET module 402. There may also be one or more vias that have been formed (e.g., using the drilling/electroplating techniques discussed earlier) in the second FET module 418. The layers and components of the second FET module 418 have been pre-laminated together prior to attachment to the first FET module 402.

The second FET module 418 is then aligned over the first FET module 402. In the illustrated embodiment, the via 420b in the second FET module 418 is aligned with the via 420a in the first FET module 402. The traces and/or contacts on the foil layer on the bottom surface of the second FET module 418 are also aligned with traces and/or contacts on the second foil layer 108b on the top surface of the first FET module 402. The first and second FET modules 402/418 are then positioned onto one another and laminated together. As a result, the two vias 420a and 420b cooperate to create the first via 110a and the integrated circuit package 100 of FIGS. 1 and 4H is formed.

Optionally, one or more additional electrical devices can be attached to the structure (step 314 of FIG. 3 and FIG. 5) In FIG. 5, for example, an electrical device 136 (e.g., an inductor) is soldered to contact pads 422 on the top surface of the laminated structure. (The laminated structure may be almost identical to and/or have any of the features of the package 100 illustrated in FIG. 1 or 4H.) The contact pads 422 are connected with one or more vias that electrically couple the electrical device 136 with one of the FETs. The electrical device 136 can be any suitable passive or active device, such as a capacitor or an integrated circuit. There may also be more than one component that is added at this stage.

In another optional step, a portion of the laminated structure is encapsulated in molding material (step 316 of FIG. 3). In the embodiment illustrated in FIG. 5, for example, molding material 138 encapsulates the electrical device 136 and the top surface of the laminated structure. In another embodiment, molding material covers the top and side surfaces of the laminated structure, while leaving the bottom surface and its associated contact pads uncovered. In still other embodiments, no molding material is used and the laminated structure is exposed.

Figure 6A:
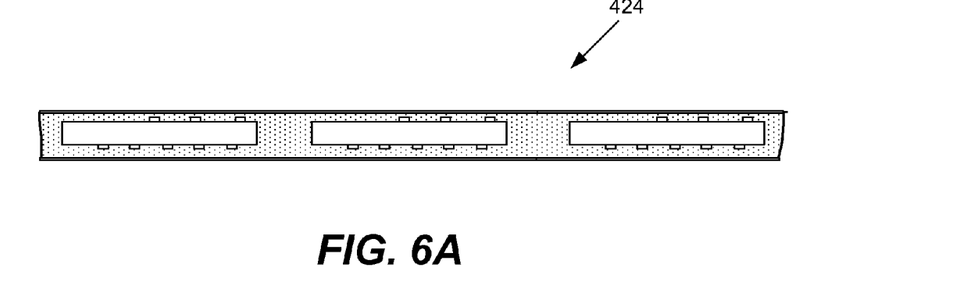
FIG. 6A is a diagrammatic side view of a panel containing multiple FET modules according to a particular embodiment of the present invention.

Although the above figures illustrate the formation of a single package using two FETs, it should be appreciated that such packages are preferably formed on a panel level in which multiple packages can be formed concurrently. FIG. 6A illustrates an example panel 424 with multiple device areas. Each device area includes the components (e.g., dielectric substrate 106, first FET 404a, first foil layer 108a, second foil layer 108b) illustrated in FIG. 4A. The operations described in FIG. 3 and FIGS. 4B-4F and 5 can be applied substantially simultaneously over each of the device areas such that each device area supports a laminated structure as illustrated in FIG. 4F or FIG. 5. That is, the panel 424 then includes multiple such laminated structures that are part of a single, continuous panel. The panel 424 is then singulated to form individual, integrated circuit packages that are similar or identical to package 100 of FIG. 1 or FIG. 4F.

Figure 6B:
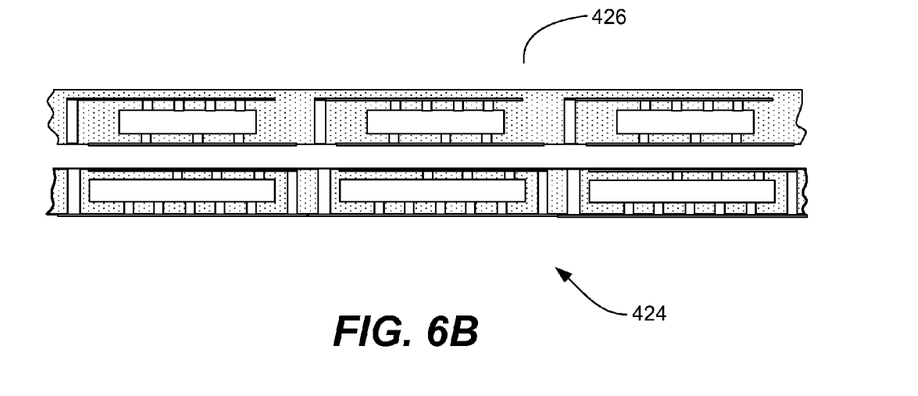
FIG. 6B is a diagrammatic side view of two FET module panels being aligned over one another according to a particular embodiment of the present invention.

FIG. 6B illustrates a similar panel-level approach involving the techniques described in connection with FIG. 4G. That is, the first laminated panel 424 also includes multiple device areas, each of which supports the first module 402 of FIG. 4G. The second laminated panel 426 includes multiple device areas, each of which supports the second module 418 of FIG. 4G. The device areas of the first and second panels are then aligned with one another and laminated together to form a single, larger panel. This panel is then singulated into multiple individual integrated circuit packages (e.g., each identical to the package 100 of FIG. 1) as discussed above.

Although only a few embodiments of the invention have been described in detail, it should be appreciated that the invention may be implemented in many other forms without departing from the spirit or scope of the invention. The figures depict specific arrangements of vias, foil layers, contact pads, integrated circuits and dielectric layers. However, it should be appreciated that these components can be arranged in a wide variety of ways that depart from what is shown in the figures. By way of example, the present invention contemplates FETs that are stacked directly over one another as well as offset. There may be more or fewer vias and foil layers. Additional passive and active components can be mounted on any surface of the package or embedded within the dielectric substrate. While particular steps for making the integrated circuit package are shown in FIGS. 4-6, the present invention should not be understood as being limited to these illustrations in any way. Almost any technique known in the field of PCB manufacturing can be used to attach or embed second FET 418 of FIGS. 4E-4H. By way of example, a dielectric layer may be added over the first module that is prelaminated with other dielectric layers, an etched foil layer, and/or an active or passive component. Fewer or more lamination operations may be used relative to what was previously described. Any reference to the word "lamination" can, in various embodiments, be understood as referring to the use of sustained, high pressures and temperatures to bond together disparate components e.g., pressures between 150 and 650 psi and temperatures between 125° C. and 200° C. (e.g., around 180-200° C.) for up to 3-4 hours. Therefore, the present embodiments should be considered as illustrative and not restrictive and the invention is not limited to the details given herein, but may be modified within the scope and equivalents of the appended claims.

What is claimed is:
1. A method comprising:
providing a first field effect transistor (FET) module, the first module comprising a first FET encased in a first dielectric substrate, the first FET having opposing top and bottom surfaces, there being a multiplicity of metallic posts on the top and bottom surfaces of the first FET, the dielectric substrate formed from a first plurality of dielectric layers that are laminated together around the first FET, the first module further comprising a plurality of metallic foil layers including first and second foil layers, the dielectric substrate and the encased first FET being sandwiched between the first and second foil layers;

forming a multiplicity of holes through the dielectric substrate and the first and second foil layers to expose the multiplicity of metallic posts on the top and bottom surfaces of the first FET;

electroplating a metal into each hole to form a conductive via that electrically connects one of the foil layers with the via, thereby electrically and physically connecting the top surface of the first FET with the second foil layer and the bottom surface of the first FET with the first foil layer;

positioning a second FET on the first FET module such that metallic posts on the second FET are electrically and physically connected with at least one of the metallic posts on the first FET via the second foil layer, thereby electrically connecting a drain of the first FET with a source of the second FET;

positioning a second plurality of dielectric layers around the second FET;

positioning a third foil layer over the second plurality of dielectric substrate and the second FET wherein the second FET, the second plurality of dielectric layers and the third foil layer cooperate to form a second FET module; and laminating the first module and the second module together to form an integrated circuit package.

2. The method as recited in claim 1 further comprising attaching an electrical device over the laminated first and second modules wherein the electrical device is at least one of the group consisting of an active device and a passive device.

3. The method as recited in claim 1 wherein the second plurality of dielectric layers are positioned around the second FET after the positioning of the second FET on the first FET.

4. The method as recited in claim 1 wherein the second module is preformed such that the second plurality of dielectric layers, the third foil layer and the second FET are laminated together to form the second module and afterward the second module is positioned over the first module and laminated together with the first module.

5. The method as recited in claim 1 further comprising after the laminating of the first and second modules, forming additional holes in the integrated circuit package and electroplating metal into the additional holes to form conductive vias.

6. The method as recited in claim 1 wherein the holes are pre-drilled into the first and second modules such that formation of additional holes is not required after the laminating together of the first and second modules.

7. The method as recited in claim 1 wherein the holes are formed using a laser.

8. The method as recited in claim 1 further comprising providing a panel that includes a multiplicity of device areas, each device area including the first FET module wherein the positioning of the second FET, the positioning of the second plurality of dielectric layers, the positioning of the third foil layer and the laminating operation are performed substantially concurrently at each device area such that the panel includes the multiplicity of device areas wherein each device area includes the first and second modules laminated together, the method further comprising singulating the panel to form a multiplicity of integrated circuit packages, each integrated circuit package including the first FET and the second FET.

9. The method as recited in claim 1 wherein each foil layer includes a plurality of conductive traces that are etched from a metallic foil.

10. The method as recited in claim 1 wherein each foil layer is formed from copper and at least some of the first and second pluralities of dielectric layers are formed from a prepreg material.

11. The method as recited in claim 1 wherein at least one of the group consisting of the first foil layer and the third foil layer are etched to form one or more conductive contact pads after the laminating of the first and second module.

12. The method as recited in claim 1 further comprising arranging the second foil, the first FET and the second FET such that the first FET and second FET are electrically coupled in a H-bridge configuration, the first FET being a high side FET and the second FET being a low side FET.

13. The method as recited in claim 1 further comprising arranging the integrated circuit package such that a drain contact on the top surface of the first FET is electrically connected via the second foil layer with a source contact on the bottom surface of the second FET.

14. The method as recited in claim 13 further comprising arranging the integrated circuit package such that a drain contact on a top surface of the second FET is electrically and physically coupled via the third foil layer to an I/O pad exposed on the exterior of the integrated circuit package.

15. The method as recited in claim 14 further comprising arranging the integrated circuit package such that a gate contact of the second FET is electrically and physically coupled via the second foil layer to an I/O pad exposed on the exterior of the integrated circuit package.

16. The method as recited in claim 15 further comprising arranging the integrated circuit package such that a gate contact of the first FET is electrically and physically coupled via the first foil layer to an I/O pad exposed on the exterior of the integrated circuit package.

* * * * *